(12) United States Patent
Yamauchi

(10) Patent No.: US 6,806,102 B2
(45) Date of Patent: Oct. 19, 2004

(54) METHOD OF FABRICATING SEMICONDUCTOR INTEGRATED CIRCUIT DEVICE

(75) Inventor: Hiroyuki Yamauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 84 days.

(21) Appl. No.: 10/288,470

(22) Filed: Nov. 6, 2002

(65) Prior Publication Data

US 2003/0096492 A1 May 22, 2003

(30) Foreign Application Priority Data

Nov. 21, 2001 (JP) .................................... 2001-355580

(51) Int. Cl.[7] .............................................. H01L 21/66

(52) U.S. Cl. .......................................... 438/14; 438/17

(58) Field of Search .............................. 438/14, 17, 18, 438/275

(56) References Cited

U.S. PATENT DOCUMENTS

| | | | |
|---|---|---|---|
| 5,316,878 A | | 5/1994 | Saito et al. |
| 5,369,596 A | * | 11/1994 | Tokumaru .................... 716/19 |
| 5,459,340 A | * | 10/1995 | Anderson et al. ........... 257/203 |
| 5,847,432 A | * | 12/1998 | Nozaki ....................... 257/369 |
| 6,121,123 A | | 9/2000 | Lyons et al. |
| 6,365,422 B1 | * | 4/2002 | Hewett et al. ................ 438/14 |
| 6,410,351 B1 | * | 6/2002 | Bode et al. .................. 438/14 |
| 6,528,864 B1 | * | 3/2003 | Arai ........................... 257/620 |
| 6,687,145 B2 | * | 2/2004 | Houston ...................... 365/51 |
| 2002/0081502 A1 | * | 6/2002 | Hayano et al. ................ 430/5 |

* cited by examiner

Primary Examiner—Matthew Smith
Assistant Examiner—Lex H. Malsawma
(74) Attorney, Agent, or Firm—McDermott Will & Emery LLP

(57) ABSTRACT

A method for fabricating a semiconductor integrated circuit device of the present invention forms an insulating film on a semiconductor wafer and forms a mask pattern containing a functional element or a wire on the formed insulating film. Dimensions of the mask pattern are changed in accordance with an amount of process variation occurring in the thickness or dielectric constant of the insulating film during the formation of the insulating film.

11 Claims, 8 Drawing Sheets

AVERAGE THICKNESS OF GATE INSULATING FILMS

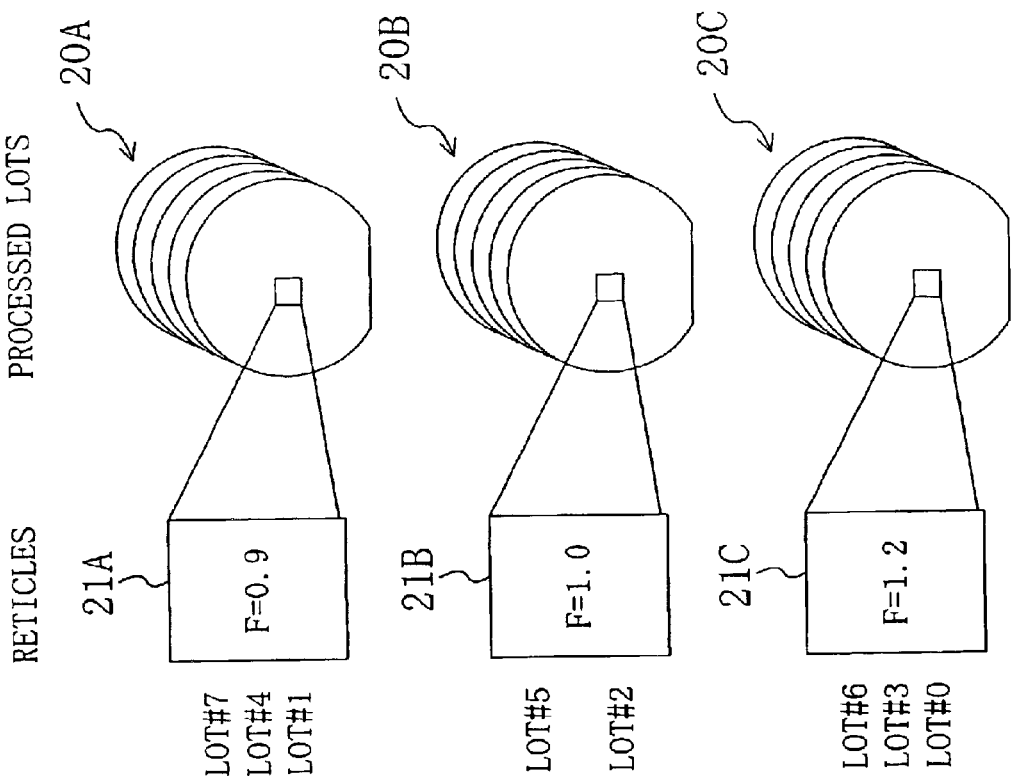
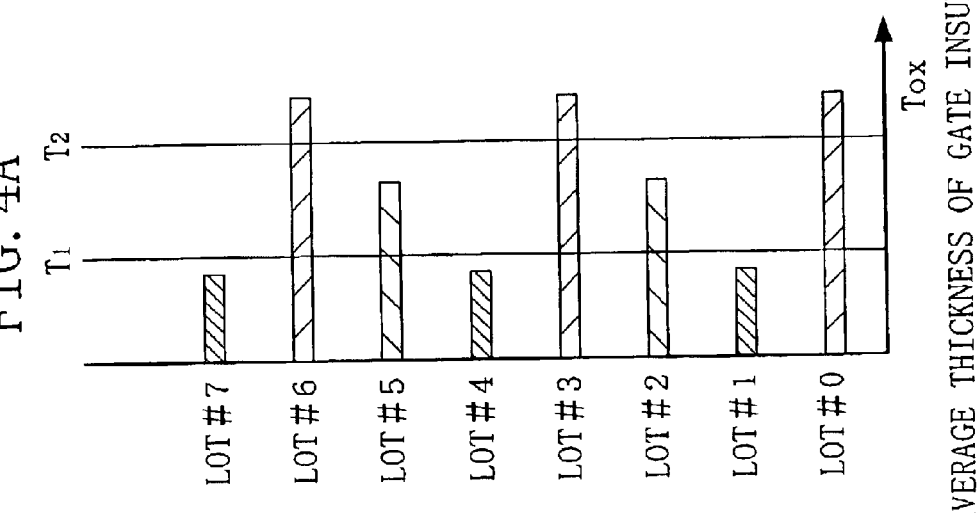

METHOD OF FABRICATING SEMICONDUCTOR INTEGRATED CIRCUIT DEVICE

BACKGROUND OF THE INVENTION

The present invention relates to a semiconductor integrated circuit device which matches the trend toward further miniaturization and to a method for designing the same.

If a plurality of functional blocks are formed in one chip, it has not been performed conventionally to provide MOS transistors contained in a plurality of digital functional circuit blocks with different gate lengths or provide the respective gate oxide films of the MOS transistors with different thicknesses.

In an analog circuit or a circuit for which consideration should be given to a latch-up or a breakdown voltage caused by an electrostatic damage (ESD), it has been conventional practice to use different design rules for a transistor provided on the I/O pad portion of the circuit and for the logic portion of the circuit. This is because different power supply voltages are applied thereto.

On the other hand, it has not been performed to use different design rules for process design within one digital functional block or one analog functional block.

It has not been performed, either, to form chips from one wafer by using different masks, form chips with different sizes or different functions from one wafer, or fabricate various chips designed to have different performances from one wafer.

As design sizes are reduced increasingly year after year, however, a chip designing process performed by using one layout design rule for one chip encounters the following problems.

The layout design rule which is 0.13 µm in the year 2001 is expected to become 0.10 µm in the year 2005. If design is to be performed in accordance with the layout design rule of 0.10 µm, a fabrication process requires a patterning accuracy on the order of several tens of nanometers.

In that case, it will become extremely difficult to control variations in patterning accuracy dependent on the regions (portions) of the principal surface of a wafer, i.e., an amount of process variation to several tens of nanometers by considering each of variations in patterning accuracy in the fabrication process, the relationship between the regions (portions) of one chip and layout densities therein, and the like.

If a design rule also considering variations in patterning accuracy is used, a design margin is reduced dramatically so that the yield rate is reduced significantly. As a consequence, the trend toward further miniaturization drastically increases the manufacturing cost for a chip.

SUMMARY OF THE INVENTION

In view of the foregoing problems expected, an object of the present invention is to positively match the trend toward a further reduction in design size.

To attain the object, a first method for fabricating a semiconductor integrated circuit device comprises: a first step of forming an insulating film on a semiconductor wafer; and a second step of forming a mask pattern containing a functional element or a wire on the insulating film and patterning the insulating film by using the formed mask pattern, the second step including changing dimensions of the mask pattern in accordance with an amount of process variation caused in a thickness or dielectric constant of the insulating film by at least the first step.

In accordance with the first method for fabricating a semiconductor integrated circuit device, even if a variation occurs in the thickness or dielectric constant of a formed insulating film, a functional element or a wire having a desired electric characteristic can be formed. This substantially reduces an amount of process variation within the semiconductor wafer and thereby allows the miniaturization of elements and the like.

In the first method for fabricating a semiconductor integrated circuit device, the insulating film is preferably a gate insulating film for a transistor.

In the first method for fabricating a semiconductor integrated circuit device, the insulating film is preferably an interlayer insulating film provided between different wiring layers.

Preferably, the first method for fabricating a semiconductor integrated circuit device further comprises the step of partitioning the semiconductor wafer into a plurality of chip formation regions, wherein the second step includes individually measuring the thickness or dielectric constant of the insulating film in each of the chip formation regions.

In the first method for fabricating a semiconductor integrated circuit device, the mask pattern is preferably a gate pattern for forming a transistor and the second step preferably includes changing a gate length dimension of the gate pattern.

In the first method for fabricating a semiconductor integrated circuit device, the mask pattern is preferably a wiring pattern having a plurality of delay circuits connected to each other and the second step preferably includes changing the wiring pattern.

In the first method for fabricating a semiconductor integrated circuit device, the second step preferably includes forming a monitor pattern for allowing the thickness or dielectric constant of the insulating film to be monitored.

A second method for fabricating a semiconductor integrated circuit device comprises: a first step of preparing a plurality of lots each containing a specified number of semiconductor wafers; a second step of forming insulating films on the respective semiconductor wafers; and a third step of forming a mask pattern containing a functional element or a wire on each of the insulating films on the semiconductor wafers and individually patterning each of the insulating films by using the formed mask pattern, the third step including changing dimensions of the mask pattern on a per lot basis in accordance with an amount of process variation caused in a thickness or dielectric constant of the insulating film by the second step.

The second method for fabricating a semiconductor integrated circuit device not only achieves the same effects as the first method for fabricating a semiconductor integrated circuit device of the present invention but also reduces an amount of process variation within the semiconductor wafer on a per lot basis.

In the second method for fabricating a semiconductor integrated circuit device, the third step preferably includes individually measuring the thickness or dielectric constant of the insulating film on each of the semiconductor wafers.

The second method for fabricating a semiconductor integrated circuit device further comprises the step of: partitioning each of the semiconductor wafers into a plurality of chip formation regions, wherein the third step includes individually measuring the thickness or dielectric constant of the insulating film on each of the chip formation regions of the semiconductor wafer.

A third method for fabricating a semiconductor integrated circuit device, the method comprises: a first step of forming insulating films on respective surfaces of a base having a polyhedral configuration; and a second step of forming a mask pattern containing a functional element or a wire on each of the insulating films and patterning the insulating film by using the formed mask pattern, the second step including individually measuring a thickness or dielectric constant of each of the insulating films on the surfaces of the base and changing dimensions of the mask pattern on each of the surfaces.

The third method for fabricating a semiconductor integrated circuit device is not limited to a plate-like semiconductor substrate used commonly. Even if a polyhedral base is used, it achieves the same effects as achieved by the first method for fabricating a semiconductor integrated circuit device of the present invention.

A fourth method for fabricating a semiconductor integrated circuit device comprises: a first step of forming, on a semiconductor wafer, chip formation regions of different sizes; and a second step of forming a functional element in each of the chip formation regions.

Even if the thickness of a film formed on a wafer undergoes fluctuation resulting from process variations, the fourth method for fabricating a semiconductor integrated circuit device substantially reduces an amount of variation since it forms the chip formation regions of different sizes on the semiconductor wafer by defining a chip formation region occupying a relative large area in the region of the semiconductor wafer where fluctuation is small and defining a chip formation region occupying a relative small area in the region of the semiconductor wafer where fluctuation is large. This allows miniaturization of elements and the like.

A fifth method for fabricating a semiconductor integrated circuit device comprises: a first step of forming a film-like member composing a functional element or a wire on a semiconductor wafer having a plurality of chip formation regions; and a second step of patterning the film-like member by using a mask pattern having a specified configuration, the mask pattern having dimensions different from one chip formation region to another in the second step.

In accordance with the fifth method for fabricating a semiconductor integrated circuit device, the dimensions of the mask pattern are different from one chip formation region to another in the second step. This substantially reduces an amount of process variation occurring in the first step during the patterning of the film-like member so that elements and the like are miniaturized.

BRIEF DESCRIPTION OF THE DRAWINGS

FIGS. 4A and 4B show a method for fabricating a semiconductor integrated circuit device according to EMBODIMENT 2 of the present invention, of which FIG. 4A is a graph showing the thicknesses of gate insulating films on a per lot basis and FIG. 4B diagrammatically shows reticles applied selectively depending on the thicknesses of the gate insulating films;

FIGS. 5A and 5B show a method for fabricating a semiconductor integrated circuit device according to EMBODIMENT 3 of the present invention, of which FIG. 5A is a graph showing the thicknesses of gate insulating films on a per wafer basis and FIG. 5B diagrammatically shows reticles applied selectively depending on the thicknesses of gate insulating films;

FIGS. 6A and 6B show a method for fabricating a semiconductor integrated circuit device according to EXAMPLE 2 of EMBODIMENT 4 of the present invention, of which FIG. 6A is a plan view and a cross-sectional view each showing the thickness distribution of a gate insulating film formed on a semiconductor wafer and FIG. 6B is a plan view of the semiconductor wafer having a principal surface thereof partitioned into virtual regions;

FIGS. 8A and 8B show a method for fabricating a semiconductor integrated circuit device according to EMBODIMENT 6 of the present invention, of which FIG. 8A is a plan view and a cross-sectional view each showing the thickness distribution of a gate insulating film formed on a semiconductor wafer and FIG. 8B is a plan view of the semiconductor wafer having a principal surface thereof partitioned into chip formation regions occupying different areas.

DETAILED DESCRIPTION OF THE INVENTION

EMBODIMENT 1

Figure 1:
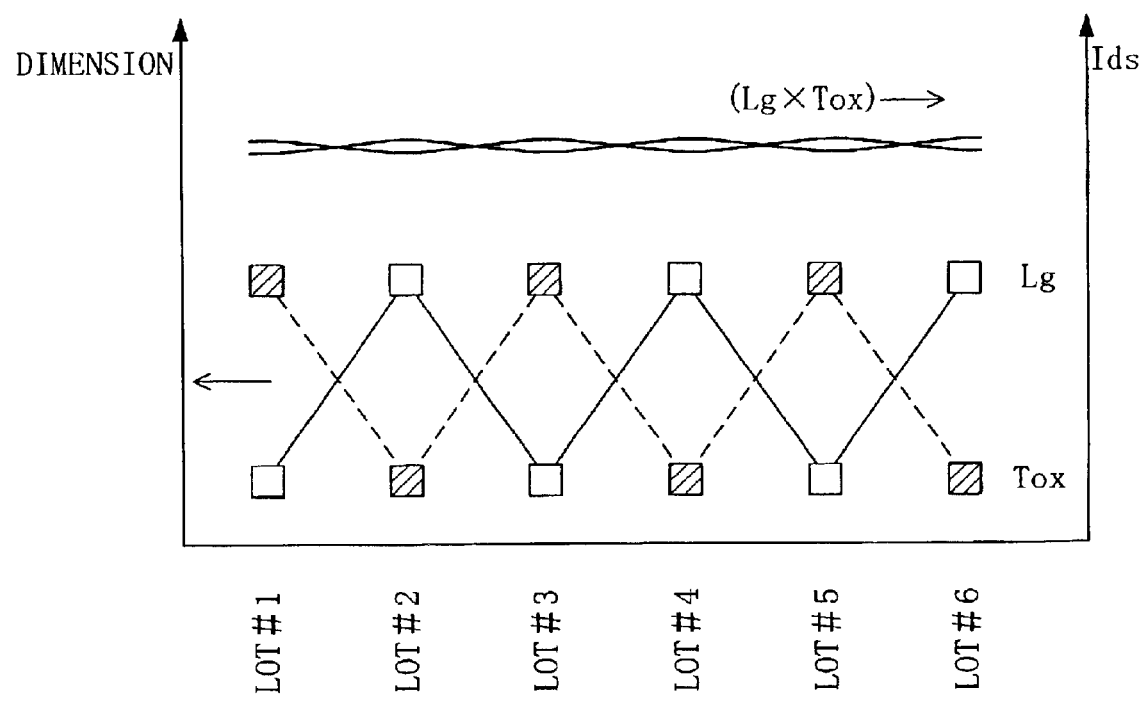
FIG. 1 is a graph illustrating a method for fabricating a semiconductor integrated circuit device according to EXAMPLE 1 of EMBODIMENT 1 of the present invention in which an amount of process variation occurring in a gate insulating film is suppressed by adjusting an applied (post-patterning) gate length.

Referring to the drawings, EMBODIMENT 1 of the present invention will be described with reference to the drawings.

As stated previously, a conventional process for fabricating a semiconductor integrated circuit device has used one type of mask for one semiconductor wafer in a lithographic step. As a consequence, the influence of an amount of process variation in the thickness or dielectric constant of an insulating film formed on the semiconductor wafer, which is caused by the process, on an amount of variation in the current characteristic or wiring capacitance of a transistor formed on the semiconductor wafer is no more negligible.

EXAMPLE 1

As an example of the insulating film, EXAMPLE 1 will describe a gate insulating film.

As shown in Numerical Expression 1, the current ability Ids of a field-effect transistor is a function of the thickness Tox of the gate insulating film and a gate length Lg. Numerical Expression 1.

$$Ids = \beta \cdot \frac{Wg}{Lg} \cdot \frac{\varepsilon}{Tox}(Vgs - Vds)^2$$

wherein Wg represents a gate width, Lg represents a gate length, $\varepsilon$ represents the dielectric constant of the insulating film, Tox represents the thickness of the gate insulating film, Vgs represents a gate-to-source potential, Vds represents a drain-to-source potential, and $\beta$ is a constant.

An exemplary case is shown in FIG. 1. From Numerical Expression 1, it will be understood that an amount of process variation can be reduced by reducing the gate length Lg if the thickness Tox of the gate insulating film is larger than a specified value as in the lot #1 and by conversely increasing the gate length Lg if the thickness Tox of the gate insulating film is smaller than the specified value as in the lot #2. From Numerical Expression 1, it will also be understood that variations in current ability Ids can be reduced by adjusting the value of the gate width Wg of the transistor.

Thus, the gate length Lg and gate width Wg of the transistor can be corrected by adjusting the dimensions of the mask pattern. If masks having different pattern dimensions are prepared and a mask which optimizes the electric characteristics of the transistor is used selectively, an amount of process variation in the thickness Tox of the gate insulating film and the fluctuation thereof across a wafer can substantially be reduced.

EXAMPLE 2

Next, a description will be given to an interlayer insulating film in multilayer wiring as another example of the insulating film.

Figure 2:
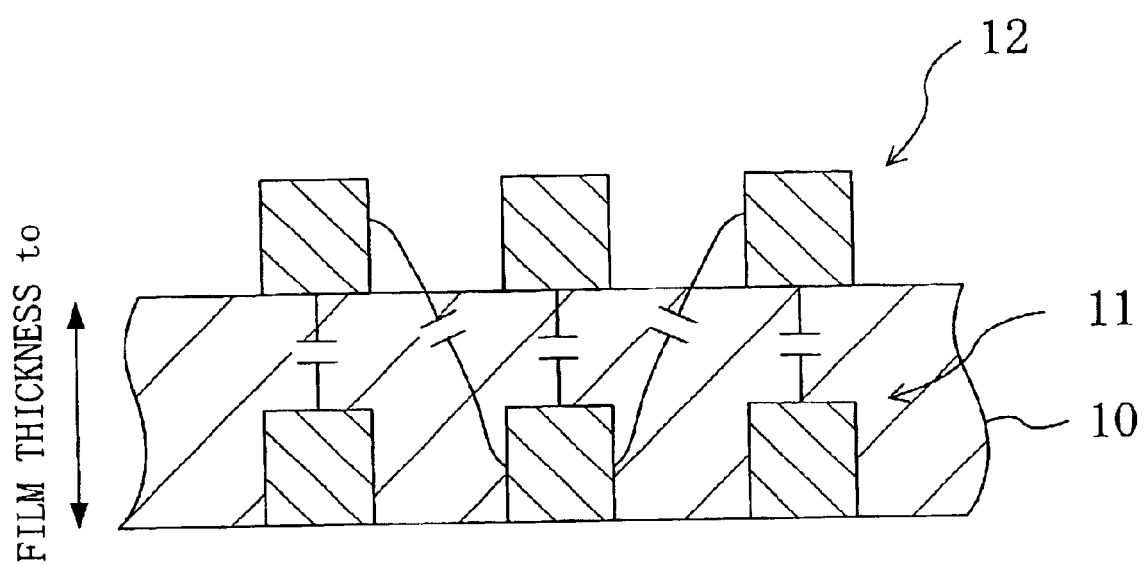
FIG. 2 is a structural cross-sectional view diagrammatically showing a wiring capacitance in a multiple wiring layer in accordance with a method for fabricating a semiconductor integrated circuit device of EXAMPLE 2 of EMBODIMENT 1.

FIG. 2 shows a cross-sectional structure of an interlayer insulating film 10 composed of, e.g., a silicon dioxide formed between a first wiring layer 11 and a second wiring layer 12 overlying the first wiring layer 11. As shown in FIG. 2, a wiring capacitance between the wiring layers 11 and 12 depends on the thickness to of the interlayer insulating film 10. Since the wiring capacitance varies an amount of signal delay in wiring, it resultantly varies an amount of delay in signal transmission. Variations in the amount of delay in signal transmission can therefore be suppressed by changing the number of delay circuits 13A, 13B, and 13C connected to each other, i.e., the number of stages.

Figure 3A:
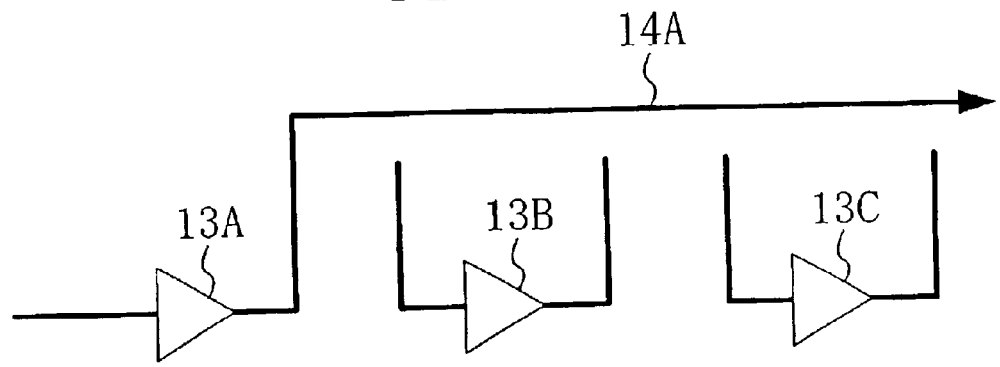
FIGS. 3A to 3C are circuit diagrams diagrammatically showing a wiring connection pattern for changing the number of delay circuits connected in a multi-stage configuration in the method for fabricating a semiconductor integrated circuit device of EXAMPLE 2 of EMBODIMENT 1
Figure 3B:
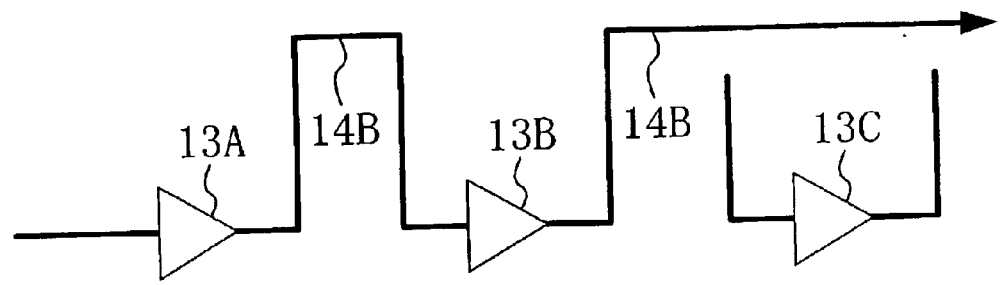
Figure 3C:
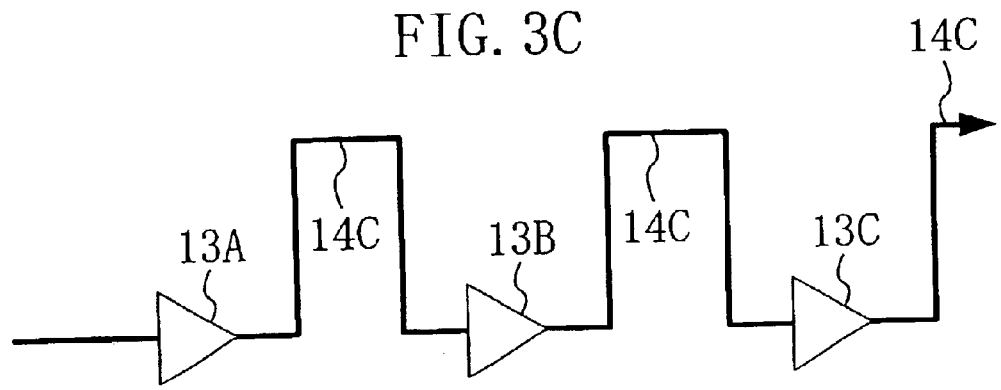

For example, FIG. 3A shows a first wiring connection pattern 14A which connects only the first delay circuit 13A of the three delay circuits 13A to 13C. FIG. 3B shows a second wiring connection pattern which connects the first and second delay circuits 13A and 13B. FIG. 3C shows a third wiring connection pattern 14C which connects all of the first, second, and third delay circuits 13A, 13B, and 13C. Through selective use of any one of the wiring connection patterns 14A, 14B, and 14C, the fluctuation of the thickness To of the interlayer insulating film 10 caused by process variations can substantially be suppressed.

Consequently, if the thickness to of the interlayer insulating film 10 is smaller than a specified value, the wiring capacitance is relatively increased to increase the amount of delay in signal transmission so that the first wiring connection pattern 14A, e.g., is applied. Conversely, if the film thickness to exceeds the specified value, the wiring capacitance is relatively reduced to reduce the amount of delay in signal transmission so that the third wiring connection pattern 14B, e.g., is applied.

By thus using not one mask but a plurality of masks having different pattern dimensions selectively depending on the distribution of an amount of process variation, EMBODIMENT 1 can reduce an amount of variation in current characteristic or wiring capacitance of the transistor.

This involves the preparation of a plurality of extra masks each having the same pattern so that the fabrication cost becomes higher. However, a reduction in the amount of process variation improves the yield rate of chips so that cost-related problems are seldom encountered.

EMBODIMENT 2

Referring to the drawings, EMBODIMENT 2 of the present invention will be described.

In EMBODIMENT 2, the thicknesses or dielectric constants of gate insulating films formed on, e.g., twenty-five semiconductor wafers contained in each of lots are measured on a per lot basis such that the average measurement value is used to select the dimensions of a mask pattern for a gate insulating film in the subsequent step. The thicknesses of the gate insulating films can be measured by an ellipsometer, an optical interferometric film thickness measurement system, or the like.

FIG. 4A shows an average value of the thicknesses Tox of the gate insulating films in eight lots (#0 to #7). As shown in FIG. 4A, the average thickness value of the gate insulating films contained in the lots #1, #4, and #7 is smaller than a first specified value $T_1$, the average thickness value of the gate insulating films contained in the lots #2 and #5 falls between the first specified value $T_1$ and a second specified value $T_2$, and the average thickness value of the gate insulating films contained in the remaining lots #0, #3, and #6 is larger than the second specified value $T_2$.

As shown in FIG. 4B, the wafers contained in the lots #1, #4, and #7 are allocated to a first group 20A, the wafers contained in the lots #2 and #5 are allocated to a second group 20B, and the wafers contained in the lots #0, #3, and #6 are allocated to a third group 20C.

The wafers in the first group 20A are patterned by using a first reticle (mask) 21A, the wafers in the second group 20B are patterned by using a second reticle (mask) 21B, and the wafers in the third group 20C are patterned by using a third reticle (mask) 21C. It is to be noted that "F" accompanying each of the reticles indicates a value representing the inverse number of the aperture ratio.

As described in EMBODIMENT 1, an amount of process variation in the thickness of a gate insulating film can be reduced by providing the transistors with different gate lengths Lg or gate widths Wg through selective use of the three reticles 21A, 21B, and 21C having different dimensions and thereby adjusting the driving abilities of the transistors.

By way of example, if three masks corresponding to different gate lengths and three masks corresponding to three wiring connection patterns for the delay circuits are prepared in consideration of even process variations in the thickness of the interlayer insulating film, the total of nine masks having nine variation patterns are applicable.

The thickness Tox of a gate insulating film can be measured not only by an optical measurement method as described above but also by electrical measurement of a capacitance and calculation from the dielectric constant of the material composing the gate insulating film.

Although the allocation of the semiconductor wafers to the groups including the first group 20A has been performed on a per lot basis, each of the groups may also be composed of the semiconductor wafers contained in different lots.

EMBODIMENT 3

Referring to the drawings, EMBODIMENT 3 of the present invention will be described.

In EMBODIMENT 3, the thicknesses or dielectric constants of gate insulating films on respective semiconductor wafers are measured not on a per lot basis but on a per wafer basis such that the measurement values are used to select the dimensions of a mask pattern for the gate insulating film on each of the semiconductor wafers. The thicknesses of the gate insulating films are also measured by using an ellipsometer or the like.

Figure 5B:
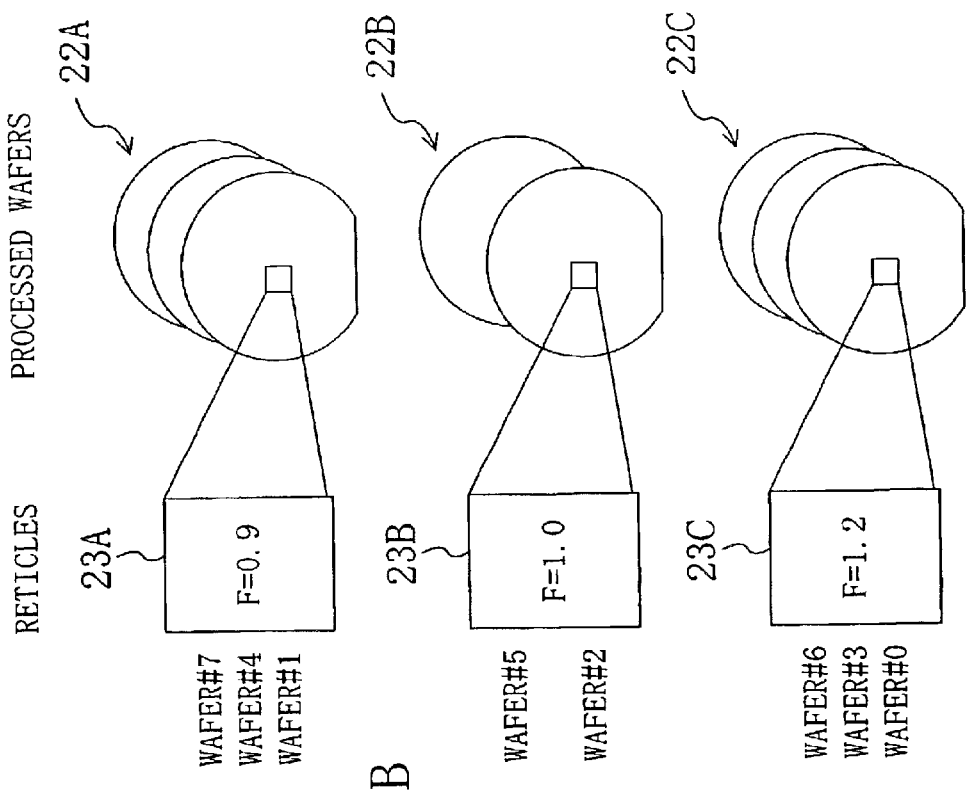
Figure 5A:
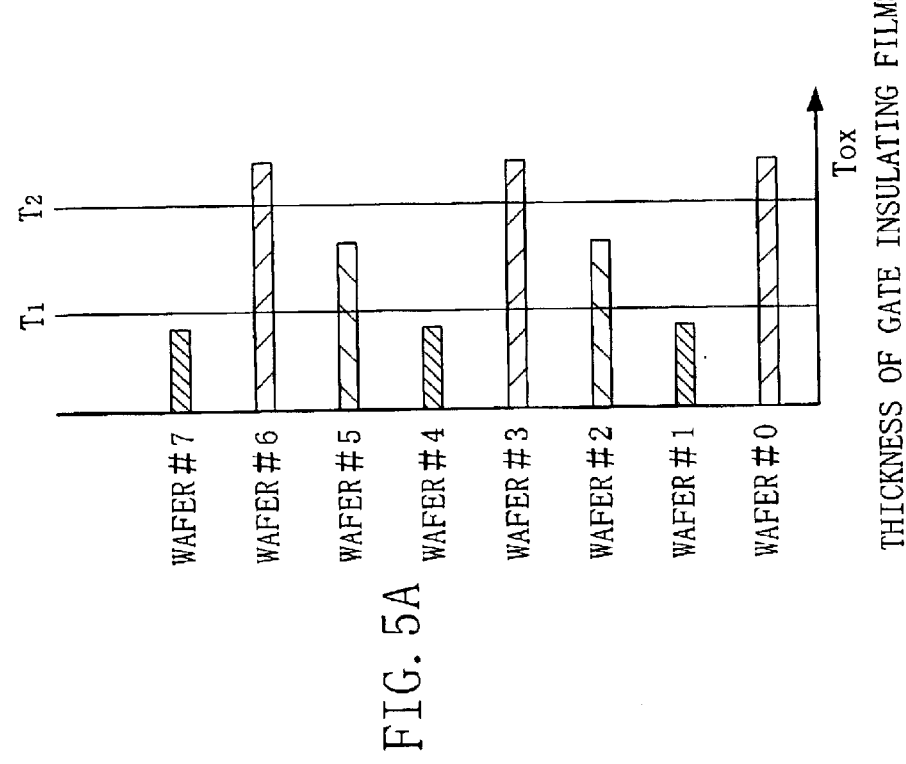

FIG. 5A shows the thicknesses Tox of the respective gate insulating films on eight (#0 to #7) semiconductor wafers. As shown in FIG. 5A, the values of the gate insulating films on the wafers #1, #4, and #7 are smaller than a first specified value $T_1$, the values of the gate insulating films on the wafers #2 and #5 fall between the first specified value $T_1$ and a second specified value $T_2$, and the values of the gate insulating films on the wafers #0, #3, and #6 are larger than the second specified value $T_2$.

As shown in FIG. 5B, the wafers #1, #4, and #7 are allocated to a first group 22A, the wafers #2 and #5 are allocated to a second group 22A, and the wafers #0, #3, and #6 are allocated to a third group 22C.

The wafers in the first group 22A are patterned by using a first reticle (mask) 23A, the wafers in the second group 22B are patterned by using a second reticle (mask) 23B, and the wafers in the third group 22C are patterned by using a third reticle (mask) 23C.

As described in EMBODIMENT 1, an amount of process variation in the thickness of a gate insulating film can be reduced by providing the transistors with different gate lengths Lg or gate widths Wg through selective use of the three reticles 21A, 21B, and 21C having different dimensions and thereby adjusting the driving abilities of the transistors.

By way of example, if three masks corresponding to different gate lengths and three masks corresponding to three wiring connection patterns for the delay circuits are prepared in consideration of even process variations in the thickness of the interlayer insulating film, the total of nine masks having nine variation patterns are applicable.

The thickness Tox of a gate insulating film can be measured not only by an optical measurement method as described above but also by electrical measurement of the dielectric constant.

Although the allocation of the semiconductor wafers to the groups including the first group 22A has been performed by assuming the same lot, each of the groups may also be composed of the semiconductor wafers contained in different lots.

EMBODIMENT 4

Referring to the drawings, EMBODIMENT 4 of the present invention will be described.

In EMBODIMENT 4, a monitor pattern for measuring the thickness or dielectric constant of a gate insulating film is formed on a chip formation region or specified region of one semiconductor wafer so that a measurement value obtained from the monitor pattern is used to select the dimensions of a mask pattern for the gate insulating film.

EXAMPLE 1

In EXAMPLE 1, monitor patterns for measuring the thickness of a gate insulating film, each composed of the same insulating film as composing the gate insulating film and having a square configuration of, e.g., 20 $\mu$m×20 $\mu$m, are formed in the same step as the gate insulating film to be located in the individual chip formation regions of one semiconductor wafer in a one-to-one relationship or at several positions in the plurality of chip formation regions, e.g., at five positions in five chip formation regions.

The measurement of the film thicknesses of the monitor patterns may be performed by using an ellipsometer or the like or by electrical measurement of capacitance and calculation from a dielectric constant.

An amount of process variation in the thickness of a gate insulating film and an amount of delay in signal transmission can be reduced by providing the transistors with different gate lengths Lg or gate widths Wg through selective use of applied mask patterns having different dimensions and thereby adjusting the driving abilities of the transistors.

The insulating film to be deposited is not limited to the gate insulating film but may be an interlayer insulating film. In this case, different wiring connection patterns may be used appropriately for delay circuits in a multi-stage configuration.

EXAMPLE 2

EXAMPLE 2 is not limited to the chip formation regions of a semiconductor wafer but partitions a principal surface of the semiconductor wafer into virtual regions as a matrix, individually measures the thickness or dielectric constant of a gate insulating film in each of the virtual regions, and uses the measurement values to select the dimensions of a mask pattern for the gate insulating film.

Figure 6B:
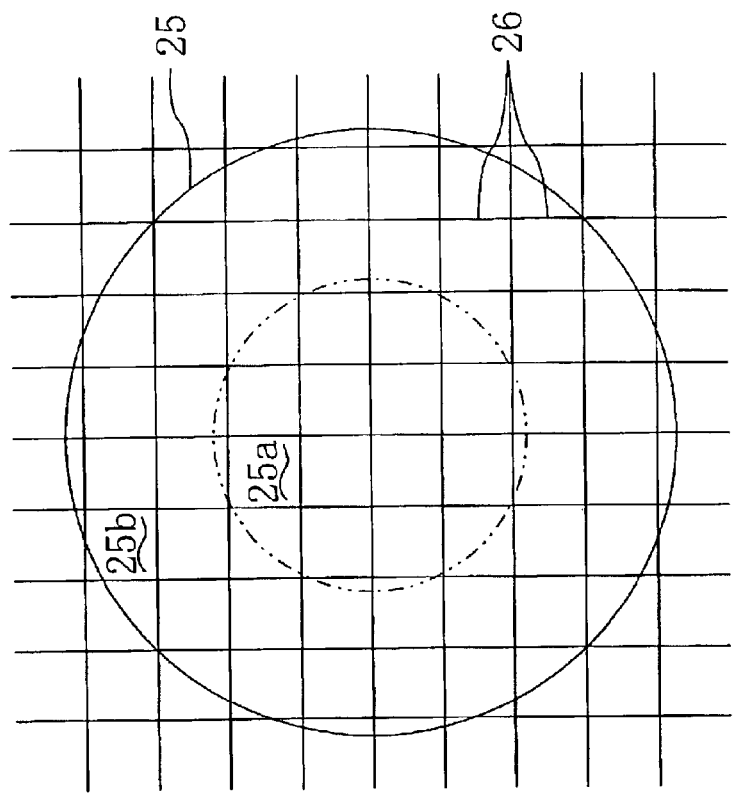
Figure 6A:
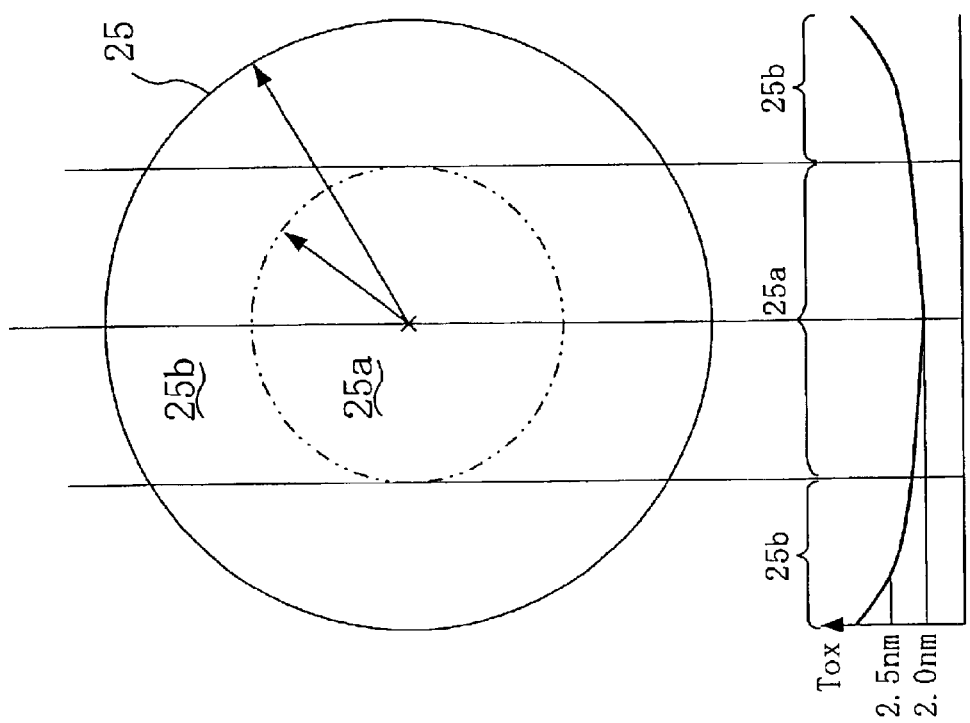

As shown in, e.g., FIG. 6A, the thickness of the gate insulating film is assumed to be larger on the peripheral portion 25b of a semiconductor wafer 25 than on the center portion 25a thereof In this case, the principal surface of the semiconductor wafer 25 is partitioned into the virtual regions 26 as a matrix, as shown in FIG. 6B.

By way of example, if three masks corresponding to different gate lengths and three masks corresponding to three wiring connection patterns for delay circuits are prepared for the virtual regions 26 in consideration of even process variations in the thickness of the interlayer insulating film, the total of nine masks having nine variation patterns are applicable. This reduces an amount of process variation in the thickness of a gate insulating film and in an amount of delay in signal transmission.

EMBODIMENT 5

Referring to the drawings, EMBODIMENT 5 of the present invention will be described.

Figure 7A:
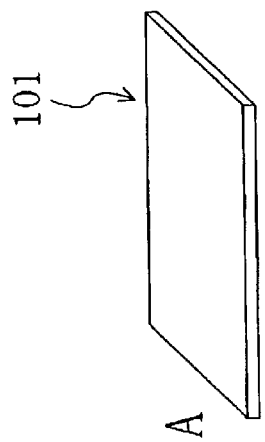
FIGS. 7A to 7C are perspective views of a base composed of a semiconductor used in a method for fabricating a semiconductor integrated circuit device according to EMBODIMENT 5 of the present invention.
Figure 7B:
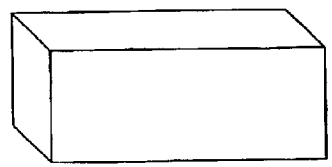
Figure 7C:
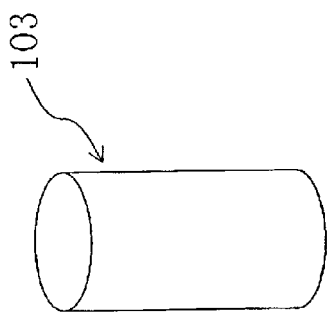

As shown in FIGS. 7A to 7C, EMBODIMENT 5 individually measures the thickness or dielectric constant of an insulating film on each of the top, bottom, and side surfaces of a polyhedral base composed of a semiconductor and uses measurement values obtained from the respective surfaces to select the dimensions of a mask pattern for an insulating film in the subsequent step.

Conventionally, a semiconductor wafer forming a semiconductor integrated circuit device has been configured as a sliced plate (101) and only the flat principal surface thereof has been used.

However, the trend toward a wafer with a larger diameter may come to a deadlock in future in terms of a trade-off between uniformity with which a processing apparatus processes a wafer and the wafer with a larger area. If consideration is given to the present state in which a spherical base is already in use, a base configured as a hexahedron such as a rectangular parallelepiped (102) or a cylinder (103) may appear in near future.

Figure 7D:
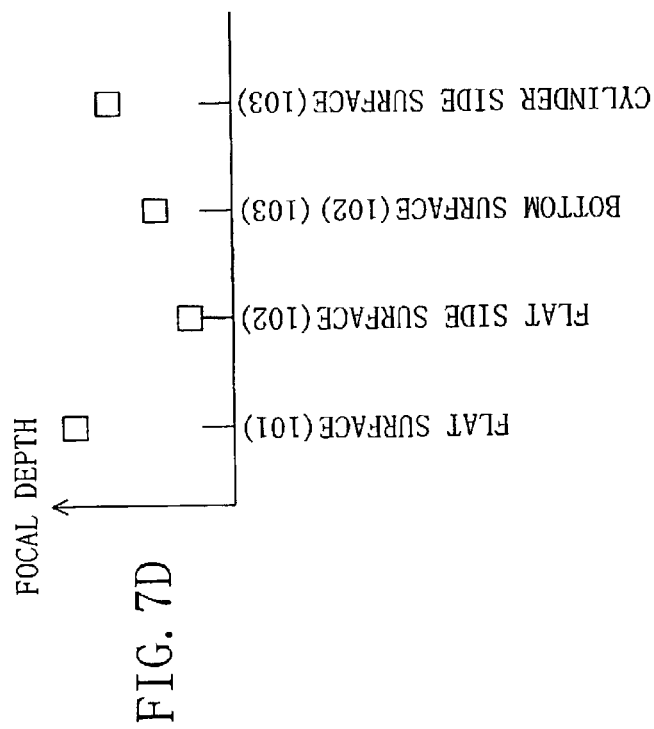
FIG. 7D is a graph sowing the dependence of a focal depth on the surface configuration of the base in a lithographic step and FIG. 7E is a graph showing the dependence of en etch rate on the surface configuration of the base in an etching step.
Figure 7E:
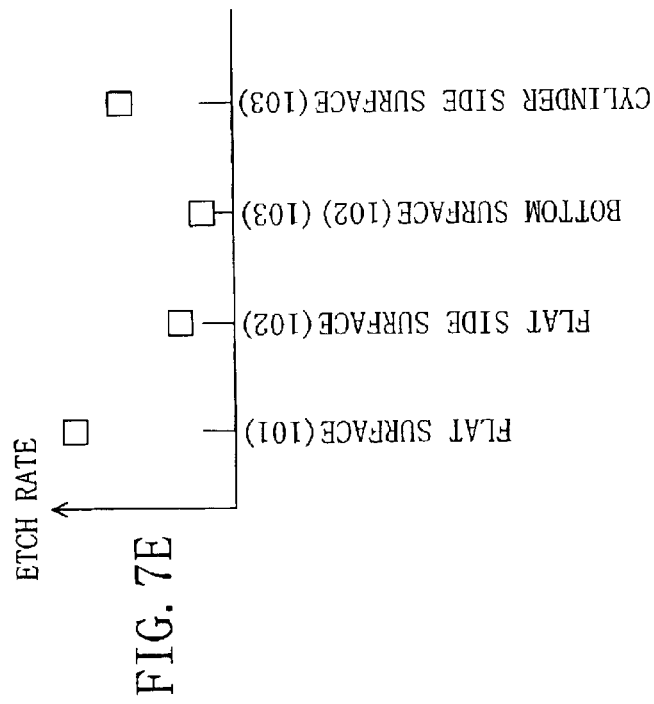

Even if an isotropic process is performed, a focal depth and an etch rate are not uniform at the individual surfaces of a hexahedron, as shown in FIGS. 7D and 7E. Accordingly, the probability that such a process as film formation or patterning is performed uniformly is low.

Therefore, fluctuation on the individual surfaces of a polyhedral semiconductor base which is dependent on an amount of process variation can be reduced by using the mask patterns having different dimensions on the individual surfaces of a polyhedron as in EMBODIMENT 5.

EMBODIMENT 6

Referring to the drawings, EMBODIMENT 6 of the present invention will be described.

As shown in FIG. 8, EMBODIMENT 6 is characterized in that chip formation regions of different chip sizes are formed on one semiconductor wafer.

Figure 8B:
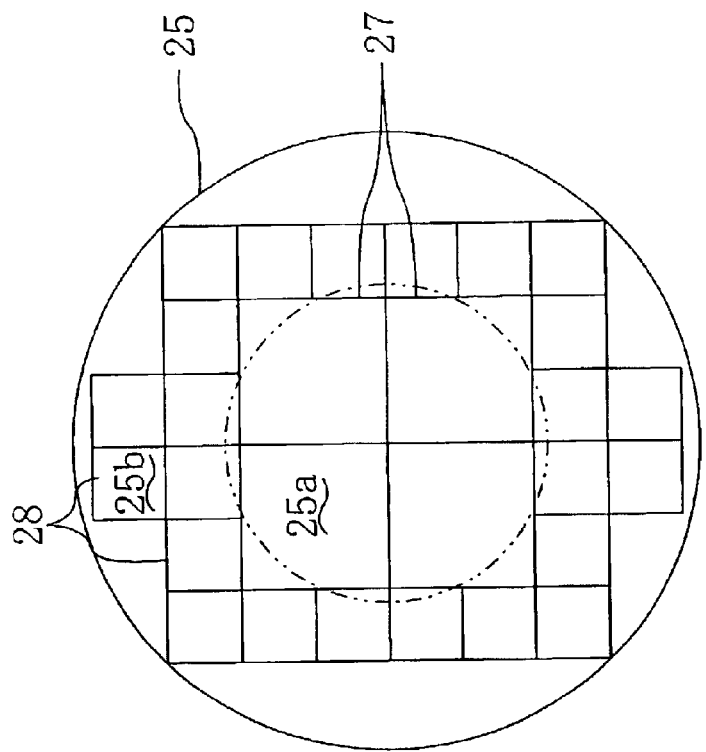
Figure 8A:
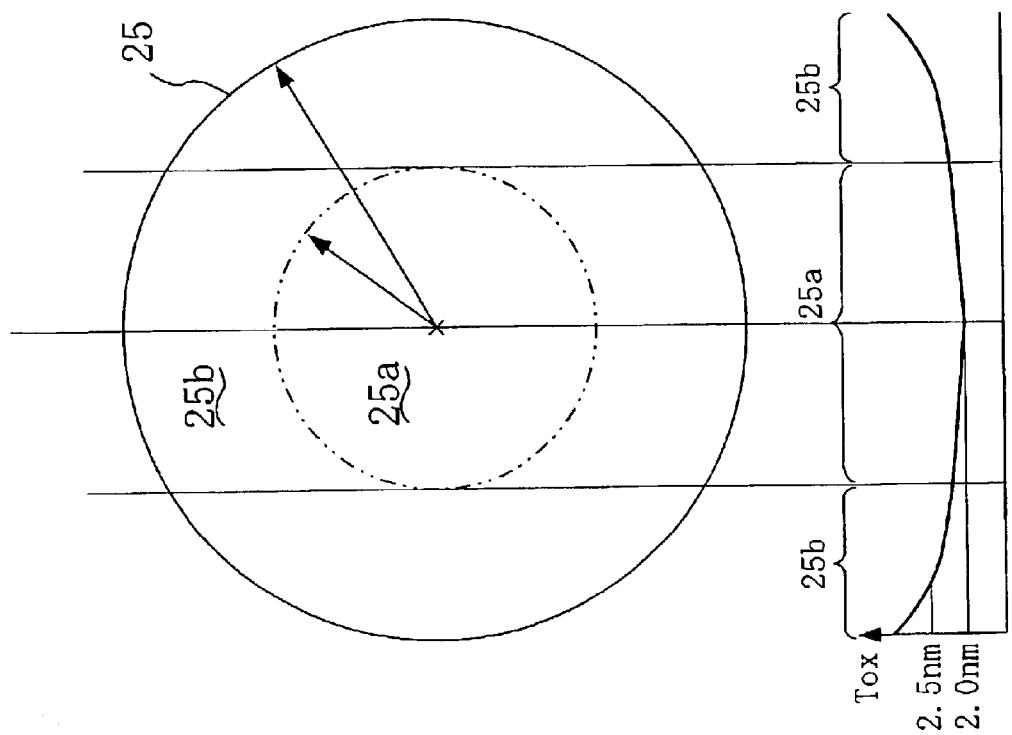

As shown in, e.g., FIG. 8A, the thickness of a gate insulating film is assumed to be larger on the peripheral portion 25b of a semiconductor wafer 25 than on the center portion 25a thereof.

In this case, EMBODIMENT 6 defines a first chip formation region 27 having a relatively large chip area on the center portion 25a of a semiconductor wafer 25, while a second chip formation region 28 having a relatively small chip area is defined on the peripheral portion 25b thereof, as shown in FIG. 8B.

Since the first chip formation region 27 has a relatively large wiring length, an operating margin for an amount of process variation in each of chips becomes critical, i.e., smaller.

Accordingly, as shown in FIG. 8A, the second chip formation region 28 less affected by the wiring length is disposed on the peripheral portion 25b of the semiconductor wafer 25 where the amount of process variation is relatively large, while the first chip formation region 27 having the chip size more susceptible to the influence of the wiring length is disposed at the center portion 25a where the amount of process variation is smaller.

Thus, the second chip formation region 28 having a relatively small chip area and therefore a large operating margin is disposed on the peripheral portion 25b of the semiconductor wafer 25 where the amount of process variation is large.

This allows even a semiconductor integrated circuit device formed on the second chip formation region 28 composed of a peripheral portion 25b where the amount of process variation is larger to positively achieve a desired operating characteristic. As a result, fluctuation in the thickness of an insulating film resulting from an amount of process variation across one semiconductor wafer 25 is reduced.

If an amount of process variation is larger on the center portion 25a of the semiconductor wafer 25 than on the peripheral portion 25b thereof, it is appropriate to dispose a second chip formation region 28 having a relatively small area on the center portion 25a and dispose the first chip formation region 27 having a relatively large area on the peripheral portion 25b.

A film formed on the semiconductor wafer 25 is not limited to the gate insulating film. Any film susceptible to process variations during the formation thereof may be used. For example, an interlayer insulating film or a conductor film for wiring formation may be used appropriately.

What is claimed is:

1. A method for fabrication a semiconductor integrated circuit device, the method comprising:

a first step of forming an insulating film on a semiconductor wafer; and a second step of forming a mask pattern containing a functional element or a wire on the insulating film and patterning the insulating film by using the formed mask pattern, the second step including changing dimensions of the mask pattern in accordance with an amount of process variation caused in a thickness or dielectric constant of the insulating film by at least the first step.

2. The method of claim 1, wherein the insulating film is a gate insulating film for a transistor.

3. The method of claim 1, wherein the insulating film is an interlayer insulating film provided between different wiring layers.

4. The method of claim 1, further comprising the step of: partitioning the semiconductor wafer into a plurality of chip formation regions, wherein the second step includes individually measuring the thickness or dielectric constant of the insulating film in each of the chip formation regions.

5. The method of claim 1, wherein the mask pattern is a gate pattern for forming a transistor and the second step includes changing a gate length dimension of the gate pattern.

6. The method of claim 1, wherein the mask pattern is a wiring pattern having a plurality of delay circuits connected to each other and the second step includes changing the wiring pattern.

7. The method of claim 1, wherein the second step includes forming a monitor pattern for allowing the thickness or dielectric constant of the insulating film to be monitored.

8. A method for fabricating a semiconductor integrated circuit device, the method comprising:

a first step of preparing a plurality of lots each containing a specified number of semiconductor wafers;

a second step of forming insulating films on the respective semiconductor wafers; and a third step of forming a mask pattern containing a functional element or a wire on each of the insulating films on the semiconductor wafers and individually patterning each of the insulating films by using the formed mask pattern, the third step including changing dimensions of the mask pattern on a per lot basis in accordance with an amount of process variation caused in a thickness or dielectric constant of the insulating film by the second step.

9. The method of claim 8, wherein the third step includes individually measuring the thickness or dielectric constant of the insulating film on each of the semiconductor wafers.

10. The method of claim 8, further comprising the step of:

partitioning each of the semiconductor wafers into a plurality of chip formation regions, wherein the third step includes individually measuring the thickness or dielectric constant of the insulating film on each of the chip formation regions of the semiconductor wafer.

11. A method for fabricating a semiconductor integrated circuit device, the method comprising:

a first step of forming insulating films on respective surfaces of a base having a polyhedral configuration; and a second step of forming a mask pattern containing a functional element or a wire on each of the insulating films and patterning the insulating film by using the formed mask pattern, the second step including individually measuring a thickness or dielectric constant of each of the insulating films on the surfaces of the base and changing dimensions of the mask pattern on each of the surfaces.

* * * * *

UNITED STATES PATENT AND TRADEMARK OFFICE
CERTIFICATE OF CORRECTION

PATENT NO. : 6,806,102 B2
DATED : October 19, 2004
INVENTOR(S) : Hiroyuki Yamauchi It is certified that error appears in the above-identified patent and that said Letters Patent is hereby corrected as shown below:

<u>Column 10,</u>
Line 5, change "fabrication" to -- fabricating --.

Signed and Sealed this

Nineteenth Day of April, 2005

JON W. DUDAS
*Director of the United States Patent and Trademark Office*